US007162570B2

(12) United States Patent
Pistilli

(10) Patent No.: US 7,162,570 B2
(45) Date of Patent: *Jan. 9, 2007

(54) FLASH MEMORY PROGRAMMING

(75) Inventor: Pasquale Pistilli, frazione Cappelle dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/369,348

(22) Filed: Mar. 7, 2006

(65) Prior Publication Data

US 2006/0149897 A1 Jul. 6, 2006

Related U.S. Application Data

(63) Continuation of application No. 10/341,314, filed on Jan. 13, 2003, now Pat. No. 7,062,599.

(30) Foreign Application Priority Data

Mar. 18, 2002 (IT) .......................... RM2002A0148

(51) Int. Cl.
*G06F 12/00* (2006.01)
(52) U.S. Cl. ..................................... 711/103
(58) Field of Classification Search ................ 711/103; 365/185.33
See application file for complete search history.

(56) References Cited

U.S. PATENT DOCUMENTS

| 5,539,696 | A | 7/1996 | Patel |
| 5,579,502 | A | 11/1996 | Konishi et al. |
| 5,745,912 | A | 4/1998 | Konishi et al. |
| 5,781,474 | A | 7/1998 | Sali et al. |
| 6,076,138 | A | 6/2000 | Shin |
| 6,085,282 | A | 7/2000 | Hansen et al. |
| 6,671,785 | B1 | 12/2003 | Dalvi et al. |
| 6,839,285 | B1 | 1/2005 | Zink et al. |
| 2002/0126537 | A1 | 9/2002 | Kreifels et al. |

OTHER PUBLICATIONS

Intel, Preliminary Datasheet, "3 Volt Intel StrataFlash Memory," 28F128J3A, 28F640J3A, 28F320J3A (x8/x16) (Jun. 2000), copyright Intel Corporation, 1997-2000, pp. 1-V, 1-52.
Intel, Application Note, "5 Volt Intel StrataFlash Memory Design Guide," AP-647, (Jul. 1999), copyright Intel Corporation, 1997, 1998, 1999, pp. 1-25.
Intel, Datasheet, 28F640L18, 28F128L18, 28F256L18, pp. 28-33, 73-75.
STMicroelectronics, Preliminary Data, "M58LW032D, 32 Mbit (4Mb x8, 2Mb x16, Uniform Block, 3V Supply Flash Memory," (Dec. 2002) copyright 2002, STMicroelectronics, pp. 1-51.

*Primary Examiner*—Hiep T. Nguyen
(74) *Attorney, Agent, or Firm*—Leffert Jay & Polglaze, P.A.

(57) ABSTRACT

The various embodiments provide for programming floating-gate, or flash, memory devices by writing a block of data words to a volatile storage media from an external processor and programming the block of words to the nonvolatile flash memory cells from the volatile storage media without the need for further input from the external processor. In this manner, a block of words may be programmed into the flash memory device using a single write command and avoiding the need for a verify operation after programming each word. By utilizing an internal volatile storage media to receive the block of words prior to writing the individual words to the memory array, the external processor is free to perform other tasks while the programming and verification are performed autonomously by the memory device. Using an external power supply facilitates parallel transfer from the internal volatile storage media to the nonvolatile flash memory cells.

34 Claims, 3 Drawing Sheets

FLASH MEMORY PROGRAMMING

RELATED APPLICATIONS

This is a continuation application of U.S. patent application Ser. No. 10/341,314 (allowed), filed Jan. 13, 2003 now U.S. Pat. No. 7,062,599, titled "FLASH MEMORY PROGRAMMING," which application is commonly assigned, the entire contents of which are incorporated herein by reference, and which application claims priority to Italian Patent Application Serial No. RM2002A000148, filed Mar. 18, 2002, titled "Flash Memory Programming," which is commonly assigned.

TECHNICAL FIELD OF THE INVENTION

The present invention relates generally to integrated circuit devices, and in particular to the programming of flash memory devices.

BACKGROUND OF THE INVENTION

Writing, or programming, a flash memory device is a complex operation. In general, an algorithm executes the writing of one byte or one word at a time in the device. Programming all or a large part of the memory can be quite time consuming. Such operations are often performed by the memory manufacturer as a part of the testing process. This ties the test equipment up for extended periods of time, slowing and adding to the cost of the manufacturing process.

For the end user, the length of time for programming typically has not been a concern. Applications generally have not written enough words to create a burden. However, as wireless web-based applications and third-generation cellular phone applications become increasingly popular, it may be required to write large blocks of the memory, e.g., downloading large MP3 files, web pages or the like.

For the reasons stated above, and for other reasons stated below that will become apparent to those skilled in the art upon reading and understanding the present specification, there is a need in the art for alternative methods for programming flash memory devices.

SUMMARY

The various embodiments provide for programming floating-gate, or flash, memory devices by writing a block of data words to a volatile storage media from an external processor and programming the block of words to the nonvolatile flash memory cells from the volatile storage media without the need for further input from the external processor. In this manner, a block of words may be programmed into the flash memory device using a single write command and avoiding the need for a verify operation after programming each word. By utilizing an internal volatile storage media to receive the block of words prior to writing the individual words to the memory array, the external processor is free to perform other tasks while the programming and verification are performed autonomously by the memory device. In addition to facilitating faster throughput during the manufacturing process, the various embodiments may also be performed in an end-user application, e.g., a cellular phone, for writing large amounts of data to the flash memory device, e.g., web pages or MP3 files. By using an external power supply to generate programming pulses, multiple words may be transferred from the internal volatile storage media to the nonvolatile flash memory cells in parallel, i.e., substantially concurrently.

For one embodiment, the invention provides a method of programming a flash memory device. The method includes receiving a block of N words into a volatile storage media associated with the flash memory device and programming each word sequentially into an array of nonvolatile memory cells after receiving the block of N words into the volatile storage media. N is some integer value greater than one.

For another embodiment, the invention provides a method of programming a flash memory device. The method includes receiving a block of N words into a volatile storage media associated with the flash memory device and programming the block of N words into an array of nonvolatile memory cells in parallel after receiving the block of N words into the volatile storage media. N is some integer value greater than one.

For yet another embodiment, the invention provides a method of programming a flash memory device. The method includes receiving a block of N words from an external processor into a volatile storage media associated with the flash memory device, wherein N is some integer value greater than one. After receiving the block of N words into the volatile storage media, the method further includes programming each word sequentially into an array of nonvolatile memory cells without the need for further input from the external processor. Optionally, after programming the block of N words into the array of nonvolatile memory cells, the method further includes comparing data values in the array of nonvolatile memory cells against data values in the volatile storage media. Any word that has a data value in the array of nonvolatile memory cells that does not match its corresponding data value in the volatile storage media is then reprogrammed.

For still another embodiment, the invention provides a method of programming a flash memory device. The method includes receiving a block of N words from an external processor into a volatile storage media associated with the flash memory device, wherein N is some integer value greater than one. After receiving the block of N words into the volatile storage media, the method further includes programming the block of N words into an array of nonvolatile memory cells in parallel without the need for further input from the external processor. Optionally, after programming the block of N words into the array of nonvolatile memory cells, the method further includes comparing data values in the array of nonvolatile memory cells against data values in the volatile storage media. Any word that has a data value in the array of nonvolatile memory cells that does not match its corresponding data value in the volatile storage media is then reprogrammed.

For a further embodiment, the invention provides a method of programming a floating-gate memory device having an array of floating-gate memory cells. The method includes receiving a write command from an external processor, sequentially receiving a plurality of data words from the external processor and storing each data word in a static random access memory (SRAM) register associated with the floating-gate memory device. Each data word may be associated with a starting address. The method further includes sequentially writing each data word from the SRAM register to the array of floating-gate memory cells. After writing all of the data words from the SRAM register to the array of floating-gate memory cells, the method further includes preparing the floating-gate memory device to verify data values in the array of floating-gate memory cells. The method still further includes verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register.

For a still further embodiment, the invention provides a method of programming a floating-gate memory device having an array of floating-gate memory cells. The method includes receiving a write command from an external processor, sequentially receiving a plurality of data words from the external processor and storing each data word in a static random access memory (SRAM) register associated with the floating-gate memory device. Each data word may be associated with a starting address. The method further includes writing the data words from the SRAM register to the array of floating-gate memory cells in parallel. After writing the data words from the SRAM register to the array of floating-gate memory cells, the method further includes preparing the floating-gate memory device to verify data values in the array of floating-gate memory cells. The method still further includes verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register.

For another embodiment, the invention provides a flash memory device. The memory device includes an array of flash memory cells and control circuitry for controlling access to the array of flash memory cells. The control circuitry is adapted to perform a method. The method includes receiving a plurality of words from an external processor into a volatile storage media associated with the flash memory device, wherein N is some integer value greater than one, and programming each word sequentially into the array of flash memory cells after receiving the plurality of words into the volatile storage media.

For another embodiment, the invention provides a flash memory device. The memory device includes an array of flash memory cells and control circuitry for controlling access to the array of flash memory cells. The control circuitry is adapted to perform a method. The method includes receiving a plurality of words from an external processor into a volatile storage media associated with the flash memory device, wherein N is some integer value greater than one, and programming the plurality of words into the array of flash memory cells in parallel after receiving the plurality of words into the volatile storage media.

Further embodiments of the invention include methods and apparatus of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

In order to increase both the end-equipment production capacity (or to reduce the production cost) and to develop advanced cellular phones, modem flash memories should have short programming times, both at the factory level and inside the end-user equipment. There are certain difficulties in reducing programming times:

The writing speed of a flash memory cell is dictated by the physical mechanism of cell programming, Channel Hot Electron. CHE is inherently slow and improvements would generally require a dramatic change in flash technology.

While in the manufacturing setting, there are power supplies available to provide the current and the voltage needed to program a flash memory. In portable applications, such as the cellular phones, the voltage and the current must be provided by charge pumps internal to the memory chip itself. The charge pumps are limited in performance because of the low Vcc power supply available. For example, Vcc can be as low as 1.42V for existing flash memories. The main limitation of the charge pumps is the level of current they can provide to the flash cells to be written. This limited current availability precludes the possibility of writing many cells in parallel or in quick succession.

The various embodiments provide methods to facilitate reductions in programming time of a flash memory device, useful both in the factory and in the end-user application. The various embodiments provide a command and associated procedure to provide autonomous on-chip execution to perform the writing of large blocks of memory locations.

Figure 1:
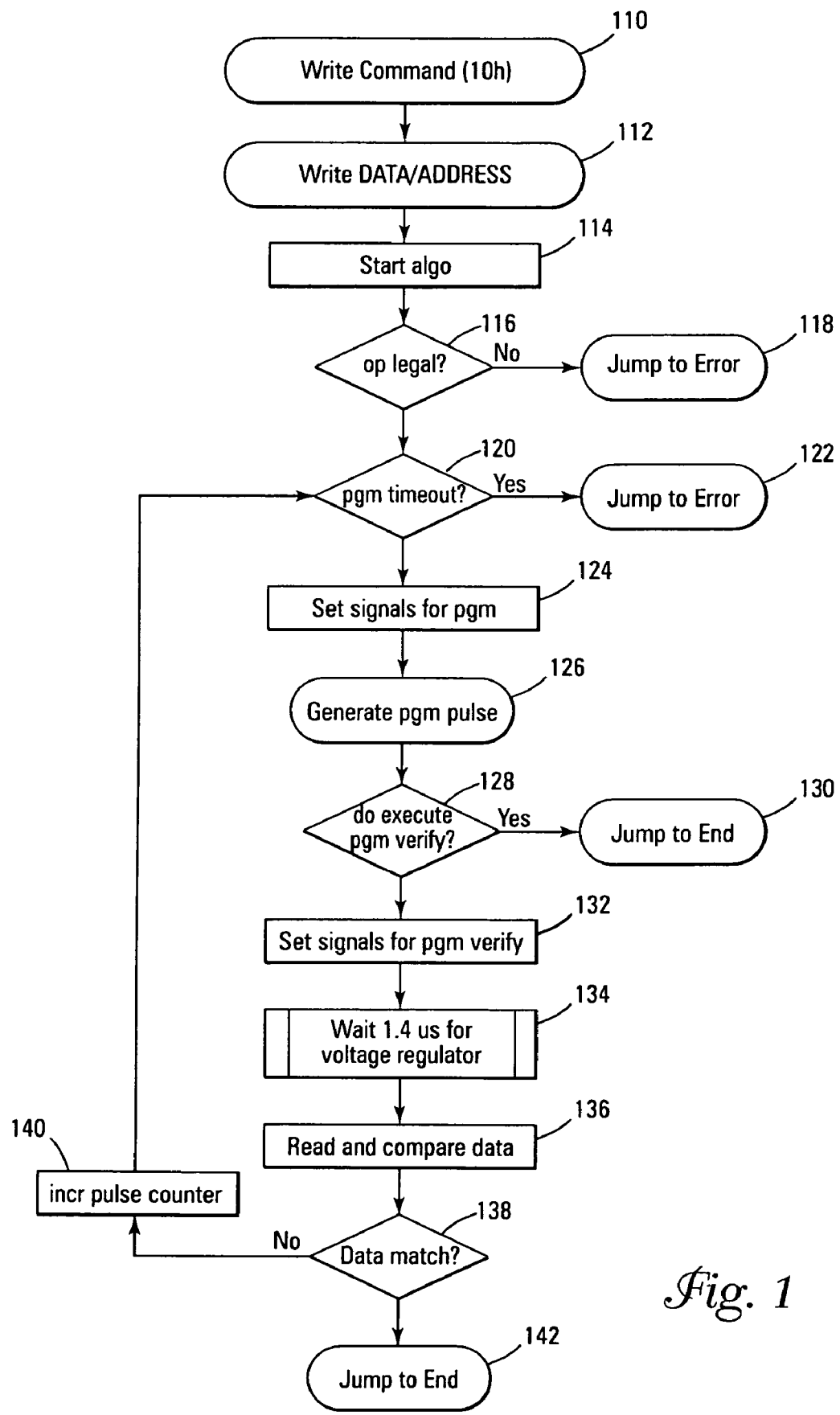
FIG. 1 is a flowchart of a typical basic sequence of programming a flash memory device.

One approach to reduce the programming time of a full memory has been to take advantage of the sequential operation of writing one word after another, reducing the time between the steps of the algorithm. One basic sequence of programming a flash memory device is shown in FIG. 1.

First a Write Command (e.g., hexadecimal code 10) is provided from an external processor to the logic controlling the flash memory at 110. The 2-instruction command also contains the data to be written, for example one word of 16 bits, and the address where the word has to be stored as given at 112. The command is decoded and the algorithm starts at 114. The algorithm first checks the legality of the operation at 116. For example, if the block in which the data is to be written is locked, the write command is not executed and an error signal is produced at 118. Assuming that the operation is legal and that no time-out has occurred at 120, the program operation is prepared by setting the needed signal outputs at 124 for programming circuits that are usually idle to avoid wasteful power consumption. This setup may proceed as follows:

Wake-up of charge pumps used for writing the memory.

Switch the output of a high-voltage charge pump to provide the programming pulse to a selected word line, i.e., to the gate of the memory cells where data is to be written.

Switch the output of another charge pump (in the range of 4.5 to 5.0 V) to the selected bit lines, i.e., to the drain of the cells to written.

Set up of the logic to generate the programming pulse.

Reset a pulse counter used to count the cycles of Write/ Verify.

When everything is set, the program pulse is generated at 126. The user may decide at this point if a program verify is to be executed at 128. Normally, a program verify is executed to make sure the writing of the memory cell has been successful. Verify is often accomplished by reading the cell using a verify voltage on its gate rather than the normal read voltage to make sure the cell has been written with a given margin. The verify voltage is normally higher than the read voltage. Data is read and compared to the original data intended to be written into the cells. For verify, the verify voltage is switched to the selected word lines while the drains of the cells are pre-charged at a pre-charge voltage (e.g., in the range of 1 V). The time needed for the verify is mainly dictated by the time needed to set-up the voltage regulators controlling the reading charge pump at 132. This time is typically in the range of 1.4 µs. After waiting for the voltage regulators at 134, the data is read and compared at 136. If the data match at 138, the write operation is completed at 142. If not, the pulse counter is incremented at 140 and another attempt is executed by again setting the signals to generate a programming pulse at 124. If, after a verify, the data still does not match, programming pulses are applied until a match occurs or until a predetermined number of write pulses is reached (a time-out). In case of a time-out, an error signal is issued at 122.

Going back and forth from write to verify voltages and vice-versa is relatively quite time consuming. Intel Corporation, Santa Clara, Calif., USA, has proposed what it calls an "Enhanced Programming Algorithm" mode, based on the concept that quite often only one programming pulse is needed to program one word. In this mode, applicable in the factory when many words have to be written in sequence, no verify is executed at the end of the writing operation and the next word is immediately written. This avoids the continuous switching from write to verify voltages and vice-versa on the selected word lines and bit lines. When all words are written, they are verified with the input data available outside the memory in the test equipment. If all data match, the operation is completed. Otherwise, the test equipment selects an erroneous word and rewrites that word only until success or time-out. Because of the statistically low occurrence of cells not sufficiently programmed by a single programming pulse, this algorithm accounts for faster overall programming time. However, this programming mode is not available to an end-user during normal operation of the device. Also, the words are written to the memory device individually, requiring the issuance of a write command for each word.

Figure 2:
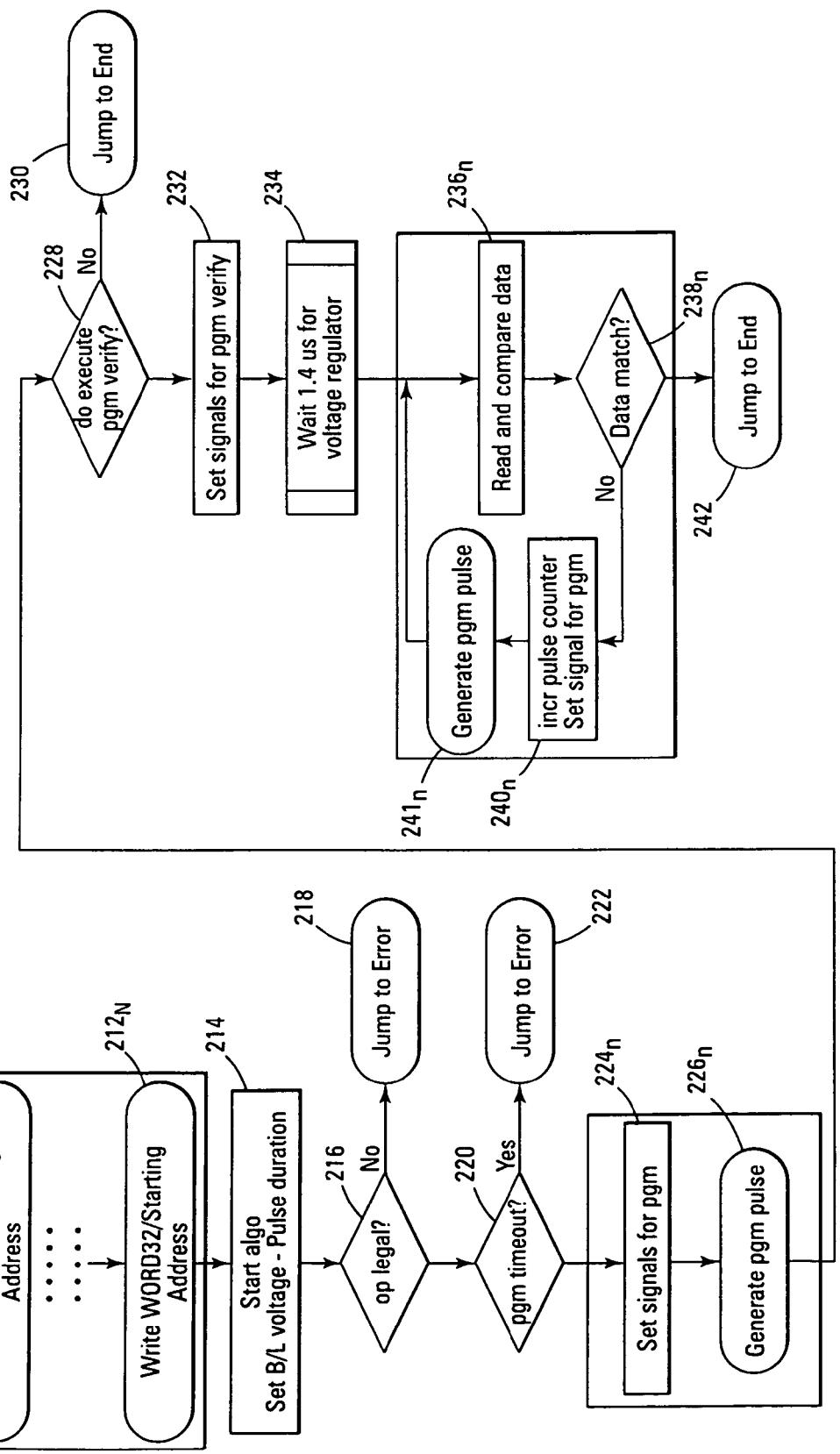
FIG. 2 is a flowchart of a method of programming a flash memory device in accordance with an embodiment of the invention.

Various embodiments of the invention described herein are applicable not only in the factory but also when the flash memory is mounted in the end-user equipment. Availability to an end-user is made possible by utilizing an internal volatile storage media, such as a data input register, commonly found in flash memory devices. Use of a static random access memory (SRAM) register is preferred, as this type of register is often present in flash memory devices. However, other types of memory having programming speeds faster than floating-gate memory cells may also be used as the volatile storage media, e.g., dynamic random access memory (DRAM). FIG. 2 is a flow diagram of one method of programming a flash memory device in accordance with an embodiment of the invention.

A write command, e.g., hexadecimal 10, is issued to the flash memory device at 210. Following issuance of the write command, a block of N words is written to the internal SRAM register associated with the flash memory device at $212_1$ through $212_N$. N is an integer value greater than one that is generally some power of two, e.g., 32. Similarly, each word typically contains some number of data bits that is also generally some power of two. The block of words can be written to the internal SRAM register quickly relative to the time required to write to floating-gate memory cells. For ease of compatibility with standard write command structure, a starting address may be associated with each word 1 through N. However, the starting address is only needed once and may only be stored or latched once, e.g., with the first or last word. During programming of the flash memory array, the starting address is automatically incremented by the address counter after each word is written, so that the N words are written in N subsequent locations despite using the single starting address.

The command is decoded and the algorithm starts at 214. The algorithm first checks the legality of the operation at 216. For example, if the block in which the data is to be written is locked, the write command is not executed and an error signal is produced at 218. Assuming that the operation is legal and that no time-out has occurred at 220, the program operation is prepared by setting the needed signal outputs at $224_n$ and generating the programming pulse at $226_n$. This sequence of $224_n$ and $226_n$, is repeated for each of the N words written to the internal SRAM register at 212.

In conjunction with programming the N words, the user may decide if a program verify is to be executed at 228. As is typical, the time needed for the verify operation is mainly dictated by the time needed to set-up the voltage regulators controlling the reading charge pump at 232. This time is typically in the range of 1.4 µs. The process waits for the voltage regulators at 234, but this only needs to occur once. Data is then read and compared at $236_n$. If the data match at $238_n$, the read and compare sequence is repeated for the next word. If no match occurs at $238_n$, the pulse counter is incremented at $240_n$, and another programming pulse is generated at $241_n$. If, after another verify, the data still does not match, programming pulses are applied until a match occurs or until a predetermined number of write pulses is reached (a time-out). In case of a time-out, an error signal is issued. The read and compare sequence is repeated, until success or time-out, to verify that all N words written to the flash memory match the originally input data contained in the internal SRAM register.

Because of the statistically low occurrence of cells not sufficiently programmed by only one programming pulse, this program accounts for faster overall programming time. The various embodiments can facilitate improvements in the average programming speed of a full memory of up to around 25% versus devices using the Enhanced Programming Algorithm and up to around 39% for devices using the standard writing algorithm of FIG. 1. Because the various embodiments make use of a random access memory associated with the flash memory device, only a single write command is required and any verify operation can be accomplished without the need to look to an external storage device. Furthermore, the memory device can utilize methods of the various embodiments whether it is being pre-programmed as part of the manufacturing process or whether it is being programmed by the end-user. Once the single write command is issued, the flash memory device can proceed autonomously through the full write operation, including any verify operation.

When in the factory, the methods of the various embodiments facilitate a further enhancement. When the flash memory device is mounted in the end-user application, the Vpp pin supplying the flash memory device is generally just a logic signal tied to Vcc. When Vpp=Vcc, the algorithm may be executed generally as shown in FIG. 2. However, if Vpp is tied to a power supply having sufficient voltage and current capacity, e.g., a +12V external power supply, multiple words, e.g., the entire block of words, may be written in parallel from the internal register to the nonvolatile memory array. Such parallel operations have not been possible using internal charge pumps. When an external power supply is available, a different write command, e.g., hexadecimal 11, could be issued to the memory device to initiate sequentially writing a block of words into the internal register and then writing the block of words in parallel from the internal register to the nonvolatile memory array. This facilitates further increases in programming speed due to the parallel nature of the transfer from the volatile internal register to the nonvolatile memory array. In this case, the improvement of the writing speed versus a standard algorithm of the type shown in FIG. 1 can reach approximately 85%. As with the method described with reference to FIG. 2, the programming of the memory device can proceed autonomously, without further input from the test equipment.

Figure 3:
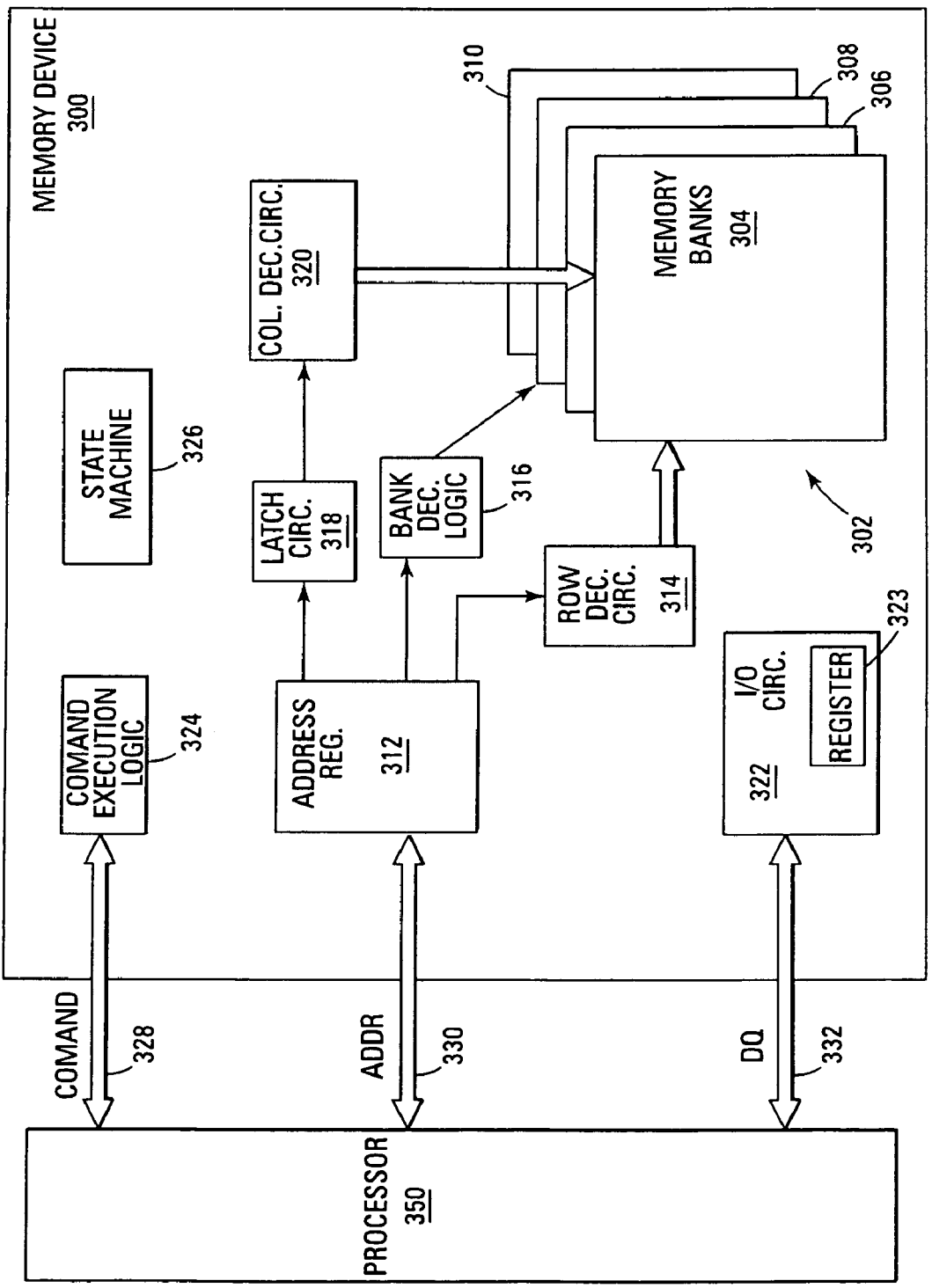
FIG. 3 is a simplified block diagram of a flash memory device in accordance with an embodiment of the invention.

FIG. 3 is a simplified block diagram of a flash memory device 300 in accordance with an embodiment of the invention. The memory device 300 includes an array of floating-gate memory cells 302. The memory array 302 is arranged in a plurality of addressable banks. In one embodiment, the memory contains four memory banks 304, 306, 308 and 310. Each memory bank contains addressable rows and columns of memory cells.

The data stored in the memory array 302 can be accessed using externally provided location addresses received by address register 312 via address signal connections 330. The addresses are decoded using bank decode logic 316 to select a target memory bank. The addresses are also decoded using row decode circuitry 314 to select the target rows. Column address counter and latch circuitry 318 couples the received and incremented addresses to column decode circuitry 320 to select one or more target columns.

Data is input and output through I/O circuit 322 via data connections 332, or DQ lines. The data connections 332 are typically used for bi-directional data communication. I/O circuit 322 includes data input and output registers, output drivers and output buffers. I/O circuit 322 may contain the internal register 323 for storing the block of data words prior to writing the words to the memory array 302.

Command execution logic 324 is provided to control the basic operations of the memory device 300 in response to control signals received via control signal connections 328. A state machine 326 may also be provided to control specific operations performed on the memory array and cells. The command execution logic 324 and/or state machine 326 can be generally referred to as control circuitry to control read, write, erase and other memory operations. The control circuitry is adapted to perform the methods of the various embodiments described herein. The memory can be coupled to an external processor 350 for operation or testing.

It will be appreciated by those skilled in the art that additional circuitry and control signals can be provided, and that the memory device of FIG. 3 has been simplified to help focus on the invention. It will be understood that the above description of a memory device is intended to provide a general understanding of the memory and is not a complete description of all the elements and features of a typical memory device.

It is further noted that as the methods of the various embodiments store the data in an internal volatile register prior to writing the data to the nonvolatile memory array, the methods can be suspended to free up resources and then resumed. For example, during a programming operation in a wireless telecommunication application, the end-user device can receive a broadcast request that suspends the programming operation, thus permitting timesharing of the flash memory device. Upon completion of the broadcast request, the memory device can resume its programming operation.

CONCLUSION

The various embodiments provide for programming floating-gate, or flash, memory devices by writing a block of data words to a volatile storage media from an external processor and programming the block of words to the nonvolatile flash memory cells from the volatile storage media without the need for further input from the external processor. In this manner, a block of words may be programmed into the flash memory device using a single write command and avoiding the need for a verify operation after programming each word. By utilizing an internal volatile storage media to receive the block of words prior to writing the individual words to the memory array, the external processor is free to perform other tasks while the programming and verification are performed autonomously by the memory device. Using an external power supply facilitates parallel transfer of the block of words from the internal volatile storage media to the nonvolatile flash memory cells.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device, comprising:
   an array of flash memory cells;
   a volatile storage media; and
   control circuitry for controlling access to the array of flash memory cells, wherein the control circuitry is adapted to perform a method, the method comprising:
      receiving a block of words from an external processor into the volatile storage media;
      after receiving the block of words into the volatile storage media, programming each word sequentially into the array of flash memory cells without the need for further input from the external processor;
      after programming the block of words into the array of flash memory cells, comparing data values in the array of flash memory cells against data values in the volatile storage media; and
      reprogramming any word that has a data value in the array of flash memory cells that does not match its corresponding data value in the volatile storage media without the need for further input from the external processor.

2. The flash memory device of claim 1, wherein, in the method performed by the control circuitry, each word of the block of words is received sequentially from the external processor and each word is associated with an address.

3. The flash memory device of claim 2, wherein, in the method performed by the control circuitry, the address is a starting address for the block of words and is the same for each word.

4. The flash memory device of claim 1, wherein, in the method performed by the control circuitry, the starting address is latched in the memory device only for the last word.

5. The flash memory device of claim 1, wherein the block of words comprises N words, where N is some integer value greater than one.

6. The flash memory device of claim 5, wherein N is some power of two.

7. The flash memory device of claim 6, wherein N is 32.

8. The flash memory device of claim 1, wherein the volatile storage media is an SRAM register or a DRAM register.

9. A flash memory device, comprising:
an array of flash memory cells;
a volatile storage media; and
control circuitry for controlling access to the array of flash memory cells, wherein the control circuitry is adapted to perform a method, the method comprising:
receiving a block of words from an external processor into the volatile storage media in response to a write command;
after receiving the block of words into the volatile storage media, programming the block of words into the array of flash memory cells in parallel without the need for further input from the external processor;
after programming the block of words into the array of flash memory cells, comparing data values in the array of flash memory cells against data values in the volatile storage media; and
reprogramming any word that has a data value in the array of flash memory cells that does not match its corresponding data value in the volatile storage media.

10. A floating-gate memory device, comprising:
an array of floating-gate memory cells;
a static random access memory (SRAM) register; and
control circuitry for controlling access to the array of floating-gate memory cells, wherein the control circuitry is adapted to perform a method, the method comprising:
receiving a write command from an external processor;
sequentially receiving a plurality of data words from the external processor, wherein each data word is associated with a starting address;
storing each data word in the SRAM register;
sequentially writing each data word from the SRAM register to the array of floating-gate memory cells;
after writing all of the data words from the SRAM register to the array of floating-gate memory cells, preparing the floating-gate memory device to verify data values in the array of floating-gate memory cells; and
verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register without the need for further input from the external processor.

11. The floating-gate memory device of claim 10, wherein, in the method performed by the control circuitry, sequentially writing each data word from the SRAM register to the array of floating-gate memory cells further comprises writing the data words to the array of floating-gate memory cells beginning at the starting address for one of the data words.

12. The floating-gate memory device of claim 10, wherein, in the method performed by the control circuitry, sequentially writing each data word from the SRAM register to the array of floating-gate memory cells further comprises writing the data words to the array of floating-gate memory cells beginning at the starting address for the last data word.

13. The floating-gate memory device of claim 10, wherein, in the method performed by the control circuitry, sequentially writing each data word from the SRAM register to the array of floating-gate memory cells further comprises:
generating a programming pulse for a first data word;
accessing a portion of the array of floating-gate memory cells corresponding to the first data word;
applying the programming pulse to the portion of the array of floating-gate memory cells corresponding to the first data word; and
repeating this sequence for each subsequent data word.

14. The floating-gate memory device of claim 13, wherein, in the method performed by the control circuitry, generating the programming pulse further comprises generating the programming pulse using a source selected from the group consisting of an internal charge pump of the floating-gate memory device in response to a first write command and an external power supply in response to a second write command.

15. The floating-gate memory device of claim 10, wherein, in the method performed by the control circuitry, the starting address for each data word is the same address.

16. The floating-gate memory device of claim 10, wherein the method performed by the control circuitry further comprises:
latching a starting address only once for the plurality of data words.

17. The floating-gate memory device of claim 10, wherein the method performed by the control circuitry further comprises:
latching the starting address for the last data word of the plurality of data words.

18. The floating-gate memory device of claim 10, wherein, in the method performed by the control circuitry, the plurality of data words is a block of data words.

19. The floating-gate memory device of claim 10, wherein the method performed by the control circuitry further comprises:
generating an error signal if a data word in the array of floating-gate memory cells cannot be verified to match its corresponding data word in the SRAM register after some predetermined number of attempts at rewriting that data word.

20. The floating-gate memory device of claim 10, wherein the method performed by the control circuitry further comprises:
suspending the method while sequentially writing each data word from the SRAM register to the array of floating-gate memory cells to permit another operation on the array of floating-gate memory cells; and
resuming the method upon completion of the other operation.

21. A floating-gate memory device, comprising:
an array of floating-gate memory cells;
a static random access memory (SRAM) register; and
control circuitry for controlling access to the array of floating-gate memory cells, wherein the control circuitry is adapted to perform a method, the method comprising:
receiving a write command from an external processor;
sequentially receiving a plurality of data words from the external processor, wherein each data word is associated with a starting address;
storing each data word in the SRAM register;
writing the data words from the SRAM register to the array of floating-gate memory cells in parallel in response to the write command;
after writing the data words from the SRAM register to the array of floating-gate memory cells, preparing the floating-gate memory device to verify data values in the array of floating-gate memory cells; and
verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register.

22. The floating-gate memory device of claim 21, wherein, in the method performed by the control circuitry, writing the data words from the SRAM register to the array of floating-gate memory cells further comprises writing a first data word to a location of the array of floating-gate memory cells associated with the starting address for one of the data words and writing remaining data words to subsequent locations of the array of floating-gate memory cells.

23. The floating-gate memory device of claim 21, wherein, in the method performed by the control circuitry, writing the data words from the SRAM register to the array of floating-gate memory cells further comprises writing a first data word to a location of the array of floating-gate memory cells associated with the starting address for the last data word and writing remaining data words to subsequent locations of the array of floating-gate memory cells.

24. The floating-gate memory device of claim 21, wherein, in the method performed by the control circuitry, writing the data words from the SRAM register to the array of floating-gate memory cells in parallel further comprises:
generating a programming pulse for each data word;
accessing portions of the array of floating-gate memory cells corresponding to each data word; and
concurrently applying each programming pulse to the portion of the array of floating-gate memory cells corresponding to its data word.

25. The floating-gate memory device of claim 24, wherein, in the method performed by the control circuitry, generating the programming pulse further comprises generating the programming pulse using an external power supply.

26. The floating-gate memory device of claim 21, wherein, in the method performed by the control circuitry, the starting address for each data word is the same address.

27. The floating-gate memory device of claim 21, wherein in the method performed by the control circuitry further comprises:
latching a starting address only once for the plurality of data words.

28. The floating-gate memory device of claim 21, wherein in the method performed by the control circuitry further comprises:
latching the starting address for the last data word of the plurality of data words.

29. The floating-gate memory device of claim 21, wherein, in the method performed by the control circuitry, the plurality of data words is a block of data words.

30. The floating-gate memory device of claim 21, wherein the method performed by the control circuitry further comprises:
generating an error signal if a data word in the array of floating-gate memory cells cannot be verified to match its corresponding data word in the SRAM register after some predetermined number of attempts at rewriting that data word.

31. An electronic system, comprising:
a processor; and
one or more flash memory devices coupled to the processor, wherein at least one of the flash memory devices comprises:
an array of flash memory cells;
volatile storage media; and
control circuitry for controlling access to the array of flash memory cells, wherein the control circuitry is adapted to perform a method, the method comprising:
receiving a plurality of words from the processor into the volatile storage media;
after receiving the plurality of words into the volatile storage media, programming each word sequentially into the array of flash memory cells;
after programming the plurality of words into the array of flash memory cells, comparing data values in the array of flash memory cells against data values in the volatile storage media; and
reprogramming any word that has a data value in the array of flash memory cells that does not match its corresponding data value in the volatile storage media without the need for further input from the processor.

32. An electronic system, comprising:
a processor; and
one or more flash memory devices coupled to the processor, wherein at least one of the flash memory devices comprises:
an array of flash memory cells;
a volatile storage media; and
control circuitry for controlling access to the array of flash memory cells, wherein the control circuitry is adapted to perform a method, the method comprising:
receiving a write command from the processor;
receiving a plurality of words from the processor into the volatile storage media; and
after receiving the plurality of words into the volatile storage media, programming the plurality of words into the array of flash memory cells in parallel in response to the write command.

33. An electronic system, comprising:
a processor; and
one or more floating-gate memory devices coupled to the processor, wherein at least one of the floating-gate memory devices comprises:
an array of floating-gate memory cells;
a static random access memory (SRAM) register; and control circuitry for controlling access to the array of floating-gate memory cells, wherein the control circuitry is adapted to perform a method, the method comprising:

receiving a write command from the processor;

sequentially receiving a plurality of data words from the processor, wherein each data word is associated with a starting address;

storing each data word in the SRAM register;

sequentially writing each data word from the SRAM register to the array of floating-gate memory cells;

after writing all of the data words from the SRAM register to the array of floating-gate memory cells, preparing the floating-gate memory device to verify data values in the array of floating-gate memory cells; and verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register without the need for further input from the processor.

34. An electronic system, comprising:

a processor; and one or more floating-gate memory devices coupled to the processor, wherein at least one of the floating-gate memory devices comprises:

an array of floating-gate memory cells;

a static random access memory (SRAM) register; and control circuitry for controlling access to the array of floating-gate memory cells, wherein the control circuitry is adapted to perform a method, the method comprising:

receiving a write command from the processor;

sequentially receiving a plurality of data words from the processor, wherein each data word is associated with a starting address;

storing each data word in the SRAM register;

writing the data words from the SRAM register to the array of floating-gate memory cells in parallel in response to the write command;

after writing the data words from the SRAM register to the array of floating-gate memory cells, preparing the floating-gate memory device to verify data values in the array of floating-gate memory cells; and verifying the data values in the array of floating-gate memory cells by comparing each data value of a word in the array of floating-gate memory cells with a corresponding word in the SRAM register and rewriting any word in the array of floating-gate memory cells that does not match its corresponding word in the SRAM register.

* * * * *